(12) United States Patent
Tsukada

(10) Patent No.: US 11,570,900 B2
(45) Date of Patent: Jan. 31, 2023

(54) CIRCUIT FORMING METHOD

(71) Applicant: FUJI CORPORATION, Chiryu (JP)

(72) Inventor: Kenji Tsukada, Toyota (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 17/285,162

(22) PCT Filed: Nov. 5, 2018

(86) PCT No.: PCT/JP2018/040950
§ 371 (c)(1),
(2) Date: Apr. 14, 2021

(87) PCT Pub. No.: WO2020/095340
PCT Pub. Date: May 14, 2020

(65) Prior Publication Data
US 2021/0298180 A1    Sep. 23, 2021

(51) Int. Cl.
*H05K 3/14*    (2006.01)
*H05K 3/02*    (2006.01)
*H05K 1/09*    (2006.01)

(52) U.S. Cl.
CPC ............. *H05K 3/022* (2013.01); *H05K 1/097* (2013.01); *H05K 3/14* (2013.01); *H05K 2201/02* (2013.01); *H05K 2203/0104* (2013.01); *H05K 2203/0756* (2013.01)

(58) Field of Classification Search
CPC .......... H05K 3/14; H05K 3/143; H05K 3/146; H05K 3/16; H05K 3/022
See application file for complete search history.

(56) References Cited

U.S. PATENT DOCUMENTS

2011/0284158 A1    11/2011    Katsumura
2013/0313687 A1*   11/2013    Bonkohara ....... H01L 21/76856
                                                                    257/621

FOREIGN PATENT DOCUMENTS

| JP | 61-166094 A | 7/1986 |
|----|-------------|--------|
| JP | 3-167890 A | 7/1991 |
| JP | 2001-143529 A | 5/2001 |
| JP | 2002-57423 A | 2/2002 |
| JP | 2004-146694 A | 5/2004 |
| JP | 2004-241514 A | 8/2004 |
| JP | 2011-243870 A | 12/2011 |
| JP | 2012-4555 A | 1/2012 |
| JP | 2014-17364 A | 1/2014 |

OTHER PUBLICATIONS

International Search Report dated Dec. 18, 2018 in PCT/JP2018/040950 filed Nov. 5, 2018, 2 pages.

* cited by examiner

*Primary Examiner* — Jeremy C Norris
(74) *Attorney, Agent, or Firm* — Oblon, McClelland, Maier & Neustadt, L.L.P.

(57) ABSTRACT

A circuit forming method, comprising: a coating step of applying a metal-containing liquid and a metal paste in an overlapping manner on a base, the metal-containing liquid containing fine metal particles and the metal paste containing a resin binder and metal particles larger than the fine metal particles in the metal-containing liquid; and a heating step of making the metal-containing liquid and the metal paste coated in the coating step conductive by heating the metal-containing liquid and the metal paste.

6 Claims, 8 Drawing Sheets

CIRCUIT FORMING METHOD

TECHNICAL FIELD

The present disclosure relates to a circuit forming method for forming a circuit by making a metal-containing liquid and a metal paste conductive, the metal-containing liquid containing fine metal particles and the metal paste containing metal particles and a resin binder.

BACKGROUND ART

As described in the following Patent Literature, technology has been developed for forming a circuit by making a metal-containing liquid, a metal paste, and the like conductive, the metal-containing liquid containing fine metal particles and the metal paste containing metal particles and a resin binder.

PATENT LITERATURE

Patent Literature 1: JP-A-2004-146694
Patent Literature 2: JP-A-2011-243870

BRIEF SUMMARY

Technical Problem

The object of the present disclosure is to appropriately form a circuit by making a metal-containing liquid and a metal paste conductive, in which the metal-containing liquid contains fine metal particles and the metal paste contains metal particles and a resin binder.

Solution to Problem

In order to solve the above-mentioned problem, the present specification discloses a circuit forming method comprising: a coating step of applying a metal-containing liquid and a metal paste in an overlapping manner on a base, the metal-containing liquid containing fine metal particles, the metal paste containing a resin binder and metal particles, a size of which being larger than that of the fine metal particles in the metal-containing liquid; and a heating step of heating the metal-containing liquid and the metal paste so that the metal-containing liquid and the metal paste, being coated in the coating step, become conductive.

Advantageous Effects

According to the present disclosure, the metal-containing liquid containing the fine metal particles and the metal paste containing the metal particles are made conductive by collectively heating the metal-containing liquid and the metal paste. Due to this, it is possible to make the metal-containing liquid and the metal paste conductive and appropriately form a circuit.

DESCRIPTION OF EMBODIMENTS

First Embodiment

Figure 1:
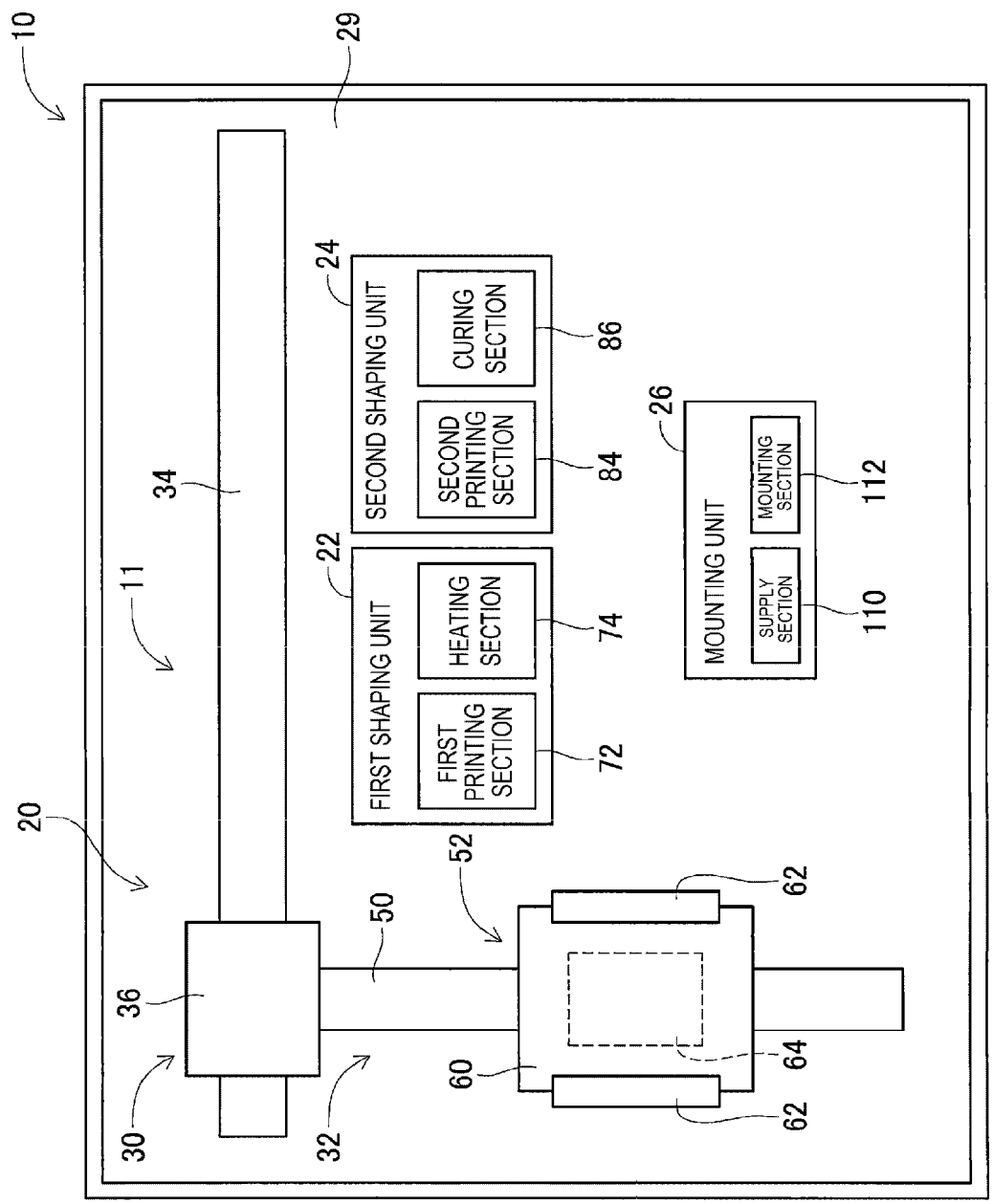
FIG. 1 is a diagram showing a circuit formation device.

FIG. 1 shows circuit formation device 10. Circuit formation device 10 includes conveyance device 20, first shaping unit 22, second shaping unit 24, mounting unit 26, and control device (see FIG. 2) 28. Conveyance device 20, first shaping unit 22, second shaping unit 24, and mounting unit 26 are disposed on base 29 of circuit formation device 10. Base 29 has a generally rectangular shape, and in the following description, a lengthwise direction of base 29 is referred to as an X-axis direction, a widthwise direction of base 29 is referred to as a Y-axis direction, and a direction orthogonal to both the X-axis direction and the Y-axis direction is referred to as a Z-axis direction.

Conveyance device 20 includes X-axis slide mechanism 30 and Y-axis slide mechanism 32. X-axis slide mechanism 30 has X-axis slide rail 34 and X-axis slider 36. X-axis slide rail 34 is disposed on base 29 to extend in the X-axis direction. X-axis slider 36 is held by X-axis slide rail 34 to be slidable in the X-axis direction. Further, X-axis slide mechanism 30 has electromagnetic motor (see FIG. 2) 38, and moves X-axis slider 36 to any position in the X-axis direction by driving electromagnetic motor 38. Furthermore, Y-axis slide mechanism 32 has Y-axis slide rail 50 and stage 52. Y-axis slide rail 50 is disposed on base 29 to extend in the Y-axis direction and is movable in the X-axis direction. A first end portion of Y-axis slide rail 50 is connected to X-axis slider 36. Stage 52 is held on Y-axis slide rail 50 to be slidable in the Y-axis direction. Further, Y-axis slide mechanism 32 has electromagnetic motor (see FIG. 2) 56, and moves stage 52 to any position in the Y-axis direction by driving electromagnetic motor 56. In this manner, stage 52 is moved to any position on base 29 with driving of X-axis slide mechanism 30 and Y-axis slide mechanism 32.

Stage 52 has base plate 60, holding devices 62, and lifting and lowering device 64. Base plate 60 is formed in a flat plate shape, and a board is placed on an upper surface of base plate 60. Holding devices 62 are provided on both sides of base plate 60 in the X-axis direction. The board placed on base plate 60 is fixedly held by sandwiching both edge portions of the board in the X-axis direction with holding devices 62. In addition, lifting and lowering device 64 is disposed under base plate 60, and lifts and lowers base plate 60.

First shaping unit 22 is a unit for shaping the wiring on a board placed on base plate 60 of stage 52 and includes first printing section 72 and heating section 74. First printing section 72 has inkjet head (see FIG. 2) 76 and dispense head (see FIG. 2) 77. Inkjet head 76 discharges metal ink in a linear manner. The metal ink is ink obtained by dispersing nanometer-sized metal fine particles in a solvent. In addition, the surface of the fine metal particles is coated with a dispersing agent to prevent aggregation of the particles in the solvent. Inkjet head 76 discharges the metal ink from multiple nozzles by a piezo type using a piezoelectric element, for example.

Dispense head 77 discharges a metal paste. The metal paste is a resin, being cured by heating, in which micrometer-sized metal particles are dispersed. Incidentally, the metal particles are flake-shaped particles. Since the viscosity of the metal paste is relatively high compared with the metal ink, dispense head 77 discharges the metal paste from one nozzle having a diameter larger than the diameter of the nozzle of inkjet head 76.

Figure 2:
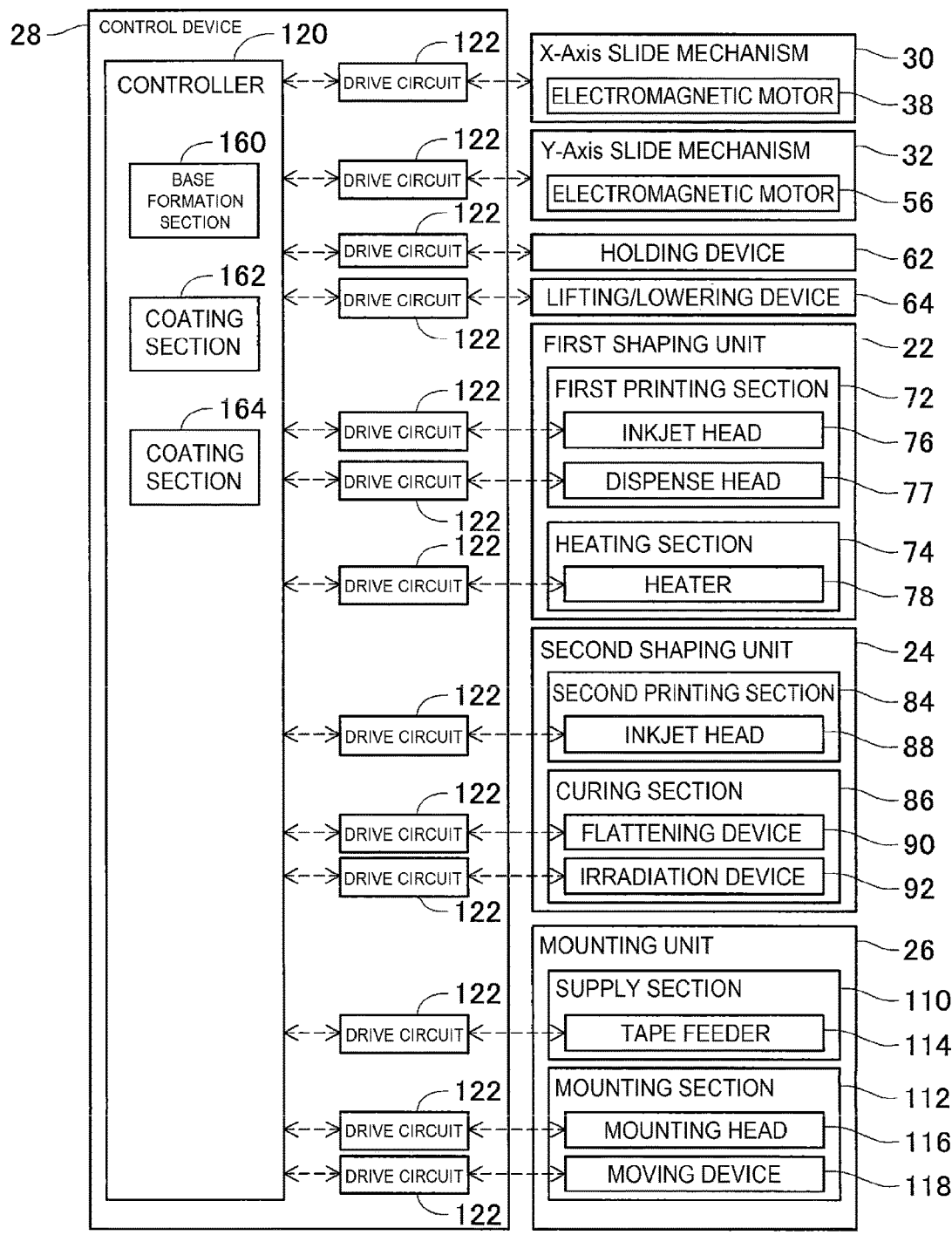
FIG. 2 is a block diagram showing a control device.

Heating section 74 has heater 78 (see FIG. 2). Heater 78 is a device for heating the metal ink discharged by inkjet head 76. The metal ink is fired by being heated with heater 78 so that wiring is formed. Firing of the metal ink is a phenomenon in which energy is applied so as to vaporize the solvent and decompose a protective film of the metal fine particle, that is, the dispersant, and the metal fine particles are contacted or fused with each other, and thus conductivity is increased. Then, the metal ink is fired to form metal wiring. Further, heater 78 is a device for heating the metal paste discharged by dispense head 77. The metal paste is heated with heater 78 to cure the resin. In this case, in the metal paste, the cured resin shrinks, and the metal particles in the form of flakes dispersed in the resin come in contact with each other. As a result, the metal paste exhibits conductivity.

Further, second shaping unit 24 is a unit that shapes a resin layer on the board placed on base plate 60 of stage 52, and has second printing section 84 and curing section 86. Second printing section 84 has inkjet head (see FIG. 2) 88, and inkjet head 88 discharges an ultraviolet curable resin. The ultraviolet curable resin is a resin that is cured by irradiation with ultraviolet rays. Inkjet head 88 may be, for example, a piezo type inkjet head using a piezoelectric element, or may be a thermal type inkjet head in which a resin is heated to generate air bubbles, which are discharged from multiple nozzles.

Curing section 86 has flattening device (see FIG. 2) 90 and irradiation device (see FIG. 2) 92. Flattening device 90 flattens an upper surface of the ultraviolet curable resin discharged by inkjet head 88, and for example, scrapes up excess resin by a roller or a blade while smoothening the surface of the ultraviolet curable resin, to make the thickness of the ultraviolet curable resin uniform. Further, irradiation device 92 includes a mercury lamp or an LED as a light source, and irradiates the discharged ultraviolet curable resin with ultraviolet rays. With this, the discharged ultraviolet curable resin is cured to form the resin layer.

Mounting unit 26 is a unit for mounting electronic components on a board mounted on base plate 60 of stage 52 and includes supply section 110 and mounting section 112. Supply section 110 has multiple tape feeders (see FIG. 2) 114 that feed the taped electronic components one by one, and supplies the electronic component to a supply position. Supply section 110 is not limited to tape feeder 114, and may be a tray-type supply device that supplies the electronic component by picking up the electronic component from a tray. Supply section 110 may be configured to include both the tape-type and the tray-type, or other type of supply device.

Mounting section 112 has mounting head (see FIG. 2) 116 and moving device (see FIG. 2) 118. Mounting head 116 has a suction nozzle (not shown) for picking up and holding the electronic component. The suction nozzle picks up and holds the electronic component by picking up air as a negative pressure is supplied from a positive and negative pressure supply device (not shown). As a slight positive pressure is supplied from the positive and negative pressure supply device, the electronic component is separated. In addition, moving device 118 moves mounting head 116 between the supply position of the electronic component by tape feeder 114 and the board placed on base plate 60. As a result, in mounting section 112, the electronic component supplied from tape feeder 114 is held by the suction nozzle, and the electronic component held by the suction nozzle is mounted on the board.

Further, as shown in FIG. 2, control device 28 includes controller 120 and multiple drive circuits 122. Drive circuits 122 are connected to electromagnetic motors 38, 56, holding device 62, lifting/lowering device 64, inkjet head 76, dispense head 77, heater 78, inkjet head 88, flattening device 90, irradiation device 92, tape feeder 114, mounting head 116, and moving device 118. Controller 120 includes CPU, ROM, RAM, or the like, mainly includes a computer, and is connected to multiple drive circuits 122. As a result, the operations of conveyance device 20, first shaping unit 22, second shaping unit 24, and mounting unit 26 are controlled by controller 120.

In circuit formation device 10, a resin laminate is formed on board 70 (see FIG. 3) with the above-described configuration, and metal ink is printed on the upper face of the resin laminate in accordance with a circuit pattern. The metal ink is made conductive by heating to form wiring. Then, although electrodes of an electronic component are connected to the wiring, the electrodes of the electronic component are connected to the wiring via metal paste in order to maximize adhesion between the resin laminate and the wiring. Note that the metal paste is also made conductive by heating so that the electronic component and the wiring are electrically connected to each other. As described above, although the circuit is formed by forming the wiring on the resin laminate and electrically connecting the electronic component to the wiring, in the conventional method, the metal ink is heated when forming the wiring and the metal paste is also heated so as to electrically connect the electronic component to the wiring. That is, the metal ink and the metal paste are individually heated. In this case, since the resin laminate is also heated, the resin laminate expands and contracts by heat load on the resin laminate so that fatigue accumulates in the resin laminate, which may cause mechanical deterioration, destruction, and the like.

Figure 3:
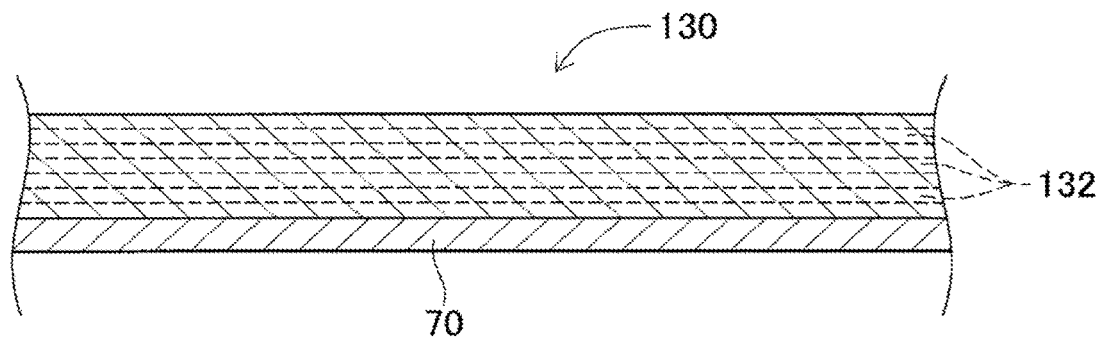
FIG. 3 is a cross-sectional view showing a circuit in a state where a resin laminate is formed.

Specifically, board 70 is set on base plate 60 of stage 52, and stage 52 is moved under second shaping unit 24. Then, in second shaping unit 24, resin laminate 130 is formed on board 70, as shown in FIG. 3. Resin laminate 130 is formed by repeating discharge of the ultraviolet curable resin from inkjet head 88 and irradiation of the discharged ultraviolet curable resin with ultraviolet rays by irradiation device 92.

More specifically, in second printing section 84 of second shaping unit 24, inkjet head 88 discharges the ultraviolet curable resin in a thin film shape onto an upper surface of board 70. Subsequently, when the ultraviolet curable resin is discharged in a thin film shape, the ultraviolet curable resin is flattened by flattening device 90 in curing section 86, such that the ultraviolet curable resin has a uniform film thickness. Then, irradiation device 92 irradiates the thin film-shaped ultraviolet curable resin with ultraviolet rays. As a result, thin film-shaped resin layer 132 is formed on board 70.

Subsequently, inkjet head 88 discharges the ultraviolet curable resin in a thin film shape onto thin film-shaped resin layer 132. Then, the thin film-shaped ultraviolet curable resin is flattened by flattening device 90, irradiation device 92 irradiates the ultraviolet curable resin discharged in a thin film shape with ultraviolet rays, and as a result, thin film-shaped resin layer 132 is laminated on thin film-shaped resin layer 132. As described above, by repeating the discharge of the ultraviolet curable resin onto thin film-shaped resin layer 132 and the irradiation of ultraviolet rays, multiple resin layers 132 are laminated and resin laminate 130 is formed.

Figure 4:
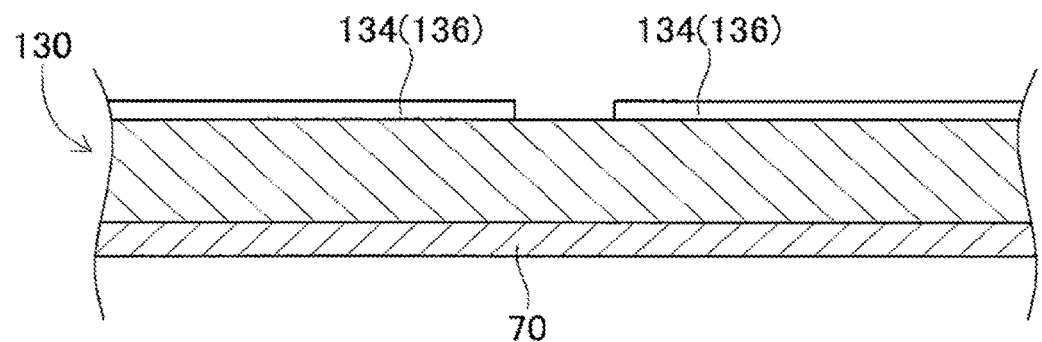
FIG. 4 is a cross-sectional view showing the circuit in a state where a wiring is formed on the resin laminate.

When resin laminate 130 is formed by the above-described procedure, stage 52 is moved under first shaping unit 22. Then, in first printing section 72 of first shaping unit 22, inkjet head 76 linearly discharges metal ink 134 onto the upper surface of resin laminate 130 in accordance with a circuit pattern as shown in FIG. 4. Subsequently, in heating section 74 of first shaping unit 22, metal ink 134 discharged in accordance with the circuit pattern is heated by heater 78. As a result, metal ink 134 is fired, and wiring 136 is formed on resin laminate 130. It should be noted that the heating temperature set to fire metal ink 134 is 120° C., and the heating time is set to one hour. Therefore, when metal ink 134 is fired, metal ink 134 is heated with heater 78 at 120° C. for one hour.

Figure 5:
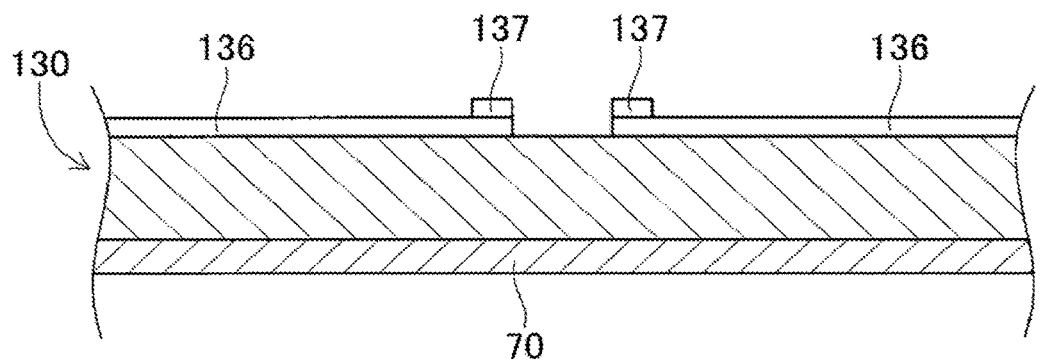
FIG. 5 is a cross-sectional view showing the circuit in a state where a metal paste is discharged on the wiring.
Figure 6:
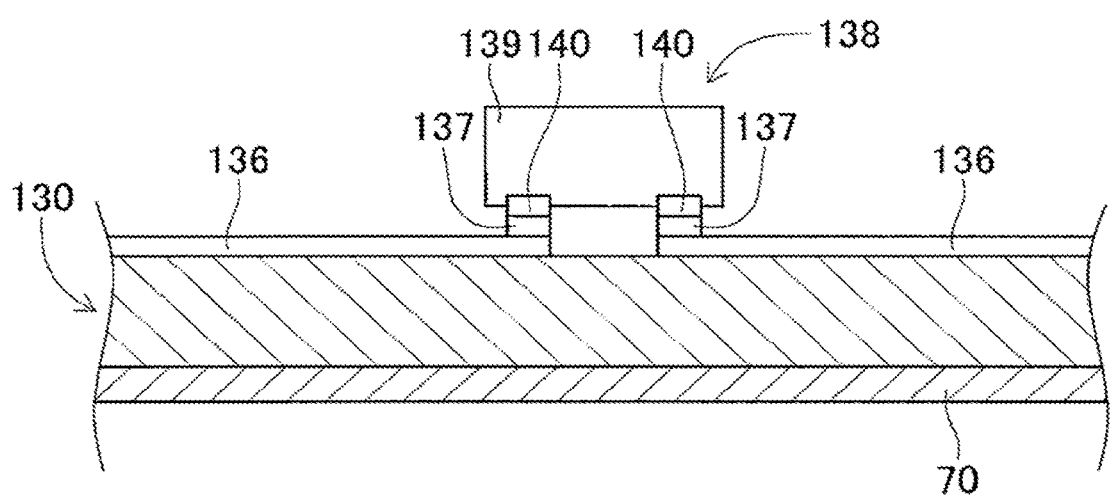
FIG. 6 is a cross-sectional view showing the circuit in a state where the electronic component is mounted.

Subsequently, when wiring 136 is formed by firing metal ink 134, dispense head 77 discharges metal paste 137 onto the end of wiring 136 in first printing section 72 of first shaping unit 22, as shown in FIG. 5. As described above, when metal paste 137 is discharged onto wiring 136, stage 52 is moved below mounting unit 26. In mounting unit 26, electronic component 138 is supplied by tape feeder 114, and electronic component 138 is held by suction nozzle of mounting head 116. As shown in FIG. 6, electronic component 138 is configured by component body 139 and two electrodes 140 disposed on the bottom face of component body 139. Then, mounting head 116 is moved by moving device 118, and electronic component 138 held by suction nozzle is attached to the upper surface of resin laminate 130. In this case, electronic component 138 is attached to the upper surface of resin laminate 130 so that electrode 140 of electronic component 138 contacts metal paste 137 discharged onto wiring 136.

Next, when electronic component 138 is mounted, stage 52 is moved below first shaping unit 22. Then, in heating section 74 of first shaping unit 22, metal paste 137 is heated with heater 78. As a result, by making metal paste 137 conductive, electrode 140 is made conductive to wiring 136 via metal paste 137, thus forming a circuit. It should be noted that the heating temperature set to make metal paste 137 conductive is 150° C., and the heating time is 1 hour and 10 minutes. When metal paste 137 is being made conductive, metal paste 137 is heated with heater 78 at 150° C. for 1 hour and 10 minutes.

However, in the above method, metal ink 134 is heated with heater 78 at 120° C. for 1 hour during firing of metal ink 134, and metal paste 137 is heated with heater 78 at 150° C. for 1 hour and 10 minutes when making metal paste 137 conductive. In this case, since resin laminate 130 is heated with heater 78 at a high temperature of 120 to 150° C. for a total of 2 hours and 10 minutes, there is a risk of mechanical deterioration, destruction, or the like occurring in resin laminate 130.

In view of this, in circuit forming device 10, metal ink 134 and metal paste 137 are collectively heated so that firing of metal ink 134 and conduction of metal paste 137 are simultaneously performed. That is, in comparison with the conventional method in which metal ink 134 and metal paste 137 are individually heated, metal ink 134 and metal paste 137 are simultaneously heated in circuit formation device 10.

Figure 7:
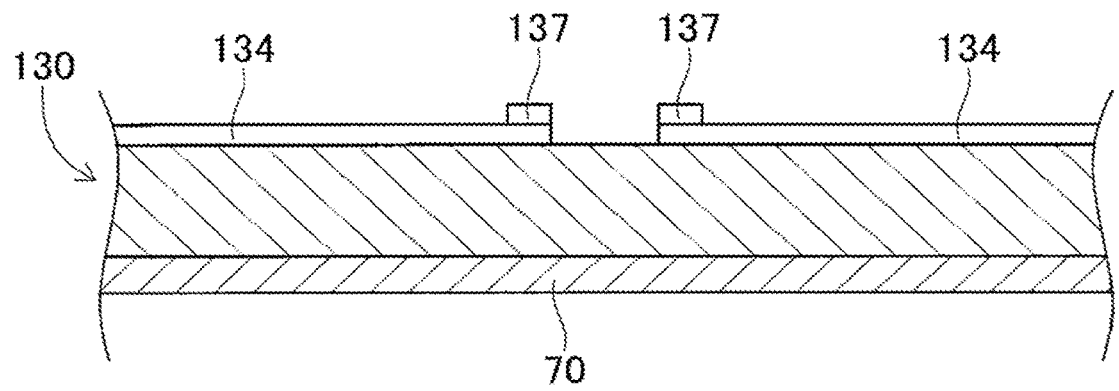
FIG. 7 is a cross-sectional view showing a circuit in a state in which the metal paste is discharged on metal ink.

Specifically, when resin laminate 130 is being formed, inkjet head 76 discharges metal ink 134 on the upper surface of resin laminate 130 in accordance with the circuit pattern in first printing section 72 of first shaping unit 22. However, at this timing, metal ink 134 is not heated, and as shown in FIG. 7, metal paste 137 is discharged on metal ink 134 by dispense head 77.

Figure 8:
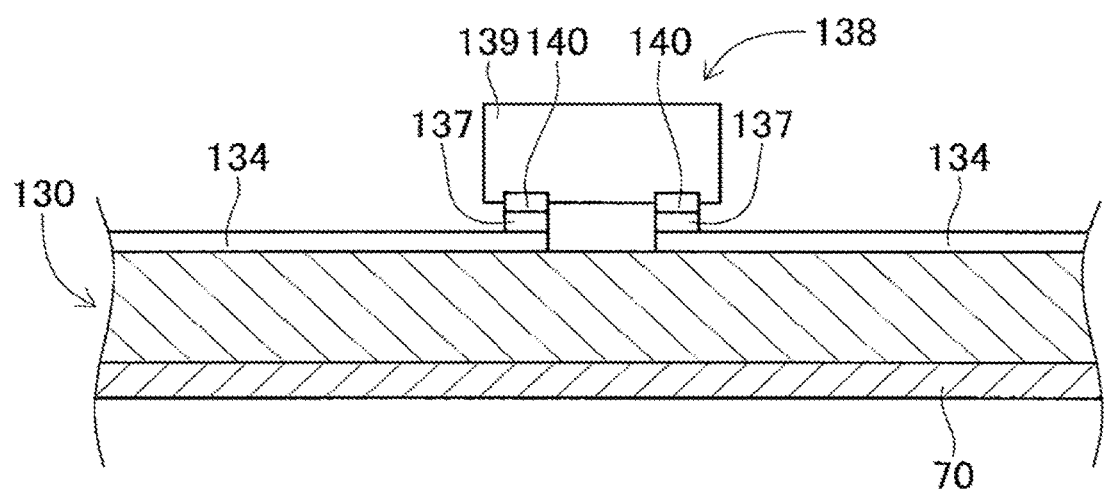
FIG. 8 is a cross-sectional view showing a circuit in a state where an electronic component is mounted.

As described above, when metal paste 137 is discharged on metal ink 134 that is not heated, stage 52 is moved below mounting unit 26. In mounting unit 26, electronic component 138 is mounted to the upper surface of resin laminate 130 so that electrodes 140 contact metal paste 137, as shown in FIG. 8. At this time, metal ink 134 and metal paste 137 are neither heated nor made conductive.

Subsequently, when electronic component 138 is mounted on the upper surface of resin laminate 130, stage 52 is moved below first shaping unit 22. Then, in heating section 74 of first shaping unit 22, metal ink 134 and metal paste 137, being discharged on metal ink 134, are heated with heater 78. That is, metal ink 134 and metal paste 137 are collectively heated. At this time, metal ink 134 is fired to form wiring 136 as well as metal paste 137 is made conductive. Due to this, electrode 140 of electronic component 138 becomes electrically connected to wiring 136 via metal paste 137, thereby forming a circuit. It should be noted that the heating temperature and the heating time when metal ink 134 and metal paste 137 are collectively heated are set to a high heating temperature and a long heating time, respectively, taken from the heating temperatures, whichever is higher, and the heating times, whichever is longer, those being used when resin laminate 130 and metal ink 134 are individually heated. For this reason, metal ink 134 and metal paste 137 are collectively heated with heater 78 at 150° C. for 1 hour and 10 minutes.

In this way, by collectively heating metal ink 134 and metal paste 137, the heating time with heater 78 when forming the circuit becomes 1 hour and 10 minutes. That is, in the conventional method, resin laminate 130 is heated with heater 78 for as long as 2 hours and 10 minutes, but in the present method, resin laminate 130 is heated with heater 78 for as little as 1 hour and 10 minutes, which is about half the time of the conventional method. As a result, it is possible to reduce the damage of resin laminate 130 and suppress the occurrence of mechanical deterioration, destruction, or the like of resin laminate 130. Further, since the heating time with heater 78 is shortened to one hour, the time required for forming the circuit is also shortened. As a result, not only can the occurrence of mechanical deterioration, destruction, or the like of resin laminate 130 be suppressed, but the cycle time can also be shortened.

Further, the heating temperature and the heating time when metal ink 134 and metal paste 137 are collectively heated are respectively set to a high heating temperature and a long heating time taken from the heating temperatures, whichever is higher, and the heating times, whichever is longer, those being used when resin laminate 130 and metal ink 134 are individually heated. As a result, metal ink 134 can be appropriately fired, and metal paste 137 can be appropriately made conductive.

However, since metal paste 137 is discharged onto metal ink 134 in the case where metal ink 134 and metal paste 137 are collectively heated, there is a concern of metal ink 134 below metal paste 137 being fired. For this reason, the resistance value, as metal ink 134 and metal paste 137 are individually heated, and the resistance value, as metal ink 134 and metal paste 137 are collectively heated, were measured.

Figure 9:
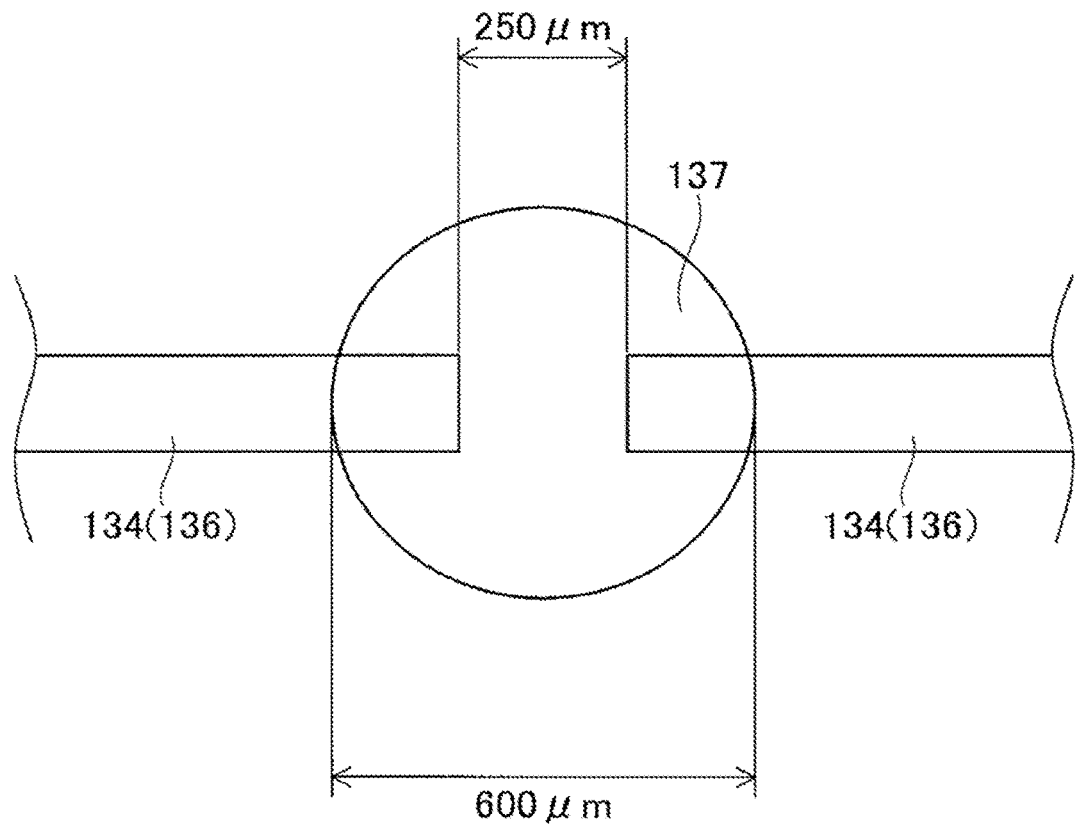
FIG. 9 is a schematic diagram showing the wiring and the metal paste at the time of resistance measurement.

Specifically, in order to measure the resistance value when metal ink 134 and metal paste 137 are individually heated, as shown in FIG. 9, metal ink 134 is discharged by inkjet head 76 so as to draw two lines and is heated with heater 78 at 120° C. for one hour. As a result, two wirings 136 are formed. Two wirings 136 are located on a straight line, and the distance between the ends is set to 250 μm. After two wirings 136 are formed, metal paste 137 is discharged by dispense head 77 so as to connect two wirings 136. Discharged metal paste 137 is circular with an outer diameter of 600 μm. Metal paste 137 is then made conductive by being heated with heater 78 at 150° C. for 1 hour and 10 minutes. In this manner, by individually heating metal ink 134 and metal paste 137, two wirings 136 become electrically energized by metal paste 137. The resistance value of metal paste 137 when supplying power to two wirings 136 was measured to be about 0.05Ω. That is, the resistance value of metal ink 134 and metal paste 137 being individually heated is about 0.05Ω.

Further, in order to measure the resistance value of metal ink 134 and metal paste 137 being collectively heated, metal ink 134 is discharged so as to draw two lines in the same manner as when the resistance value is measured when metal ink 134 and metal paste 137 are individually heated. Next, metal paste 137 is discharged so as to connect metal ink 134, discharged in two linear shapes, without heating metal ink 134. At this time, metal paste 137 is discharged in the same manner in which the resistance value is measured in the case in which metal ink 134 and metal paste 137 are individually heated. Metal ink 134 and metal paste 137 are then collectively heated with heater 78 at 150° C. for 1 hour and 10 minutes, thereby causing metal ink 134 to be fired and metal paste 137 is made conductive. In this manner, by collectively heating metal ink 134 and metal paste 137, two wirings 136 are electrically energized by metal paste 137. The resistance value of metal paste 137 at the time of supplying power to two wirings 136 was measured to be about 0.15Ω. That is, the resistance value when metal ink 134 and metal paste 137 are collectively heated is about 0.15Ω.

As described above, the resistance value (about 0.15Ω) when metal ink 134 and metal paste 137 are collectively heated is about 0.1 Ω higher than the resistance value (about 0.05Ω) when metal ink 134 and metal paste 137 are individually heated. However, the increase in the resistance value is not large in practical use compared with the wiring resistance. Therefore, a circuit formed by collectively heating metal ink 134 and metal paste 137 can also be used without any problems.

Second Embodiment

Figure 10:
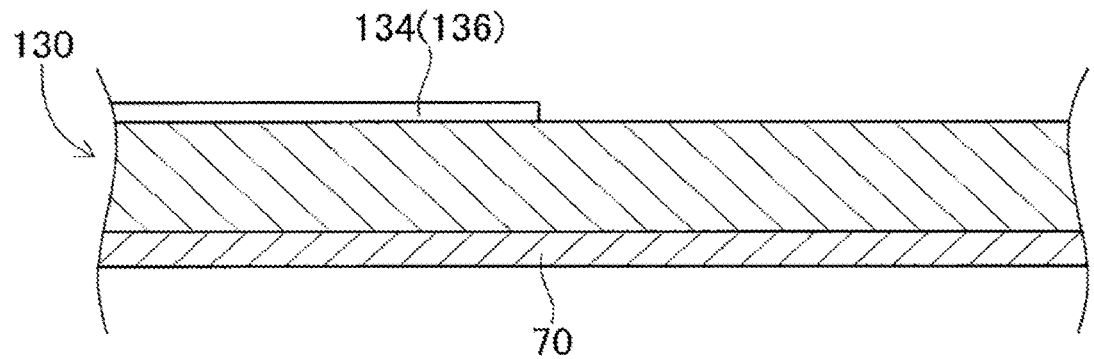
FIG. 10 is a cross-sectional view showing a circuit in a state in which the wiring is formed on the resin laminate.

In the first embodiment, electronic component 138 is electrically connected to wiring 136 via metal paste 137, whereas in the second embodiment, the two wirings formed on different resin laminates are electrically connected by the metal paste. Specifically, in first shaping unit 22, as shown in FIG. 10, metal ink 134 is linearly discharged on resin laminate 130 by inkjet head 76, and metal ink 134 is heated with heater 78 at 120° C. for one hour. As a result, wiring 136 is formed on resin laminate 130.

Figure 11:
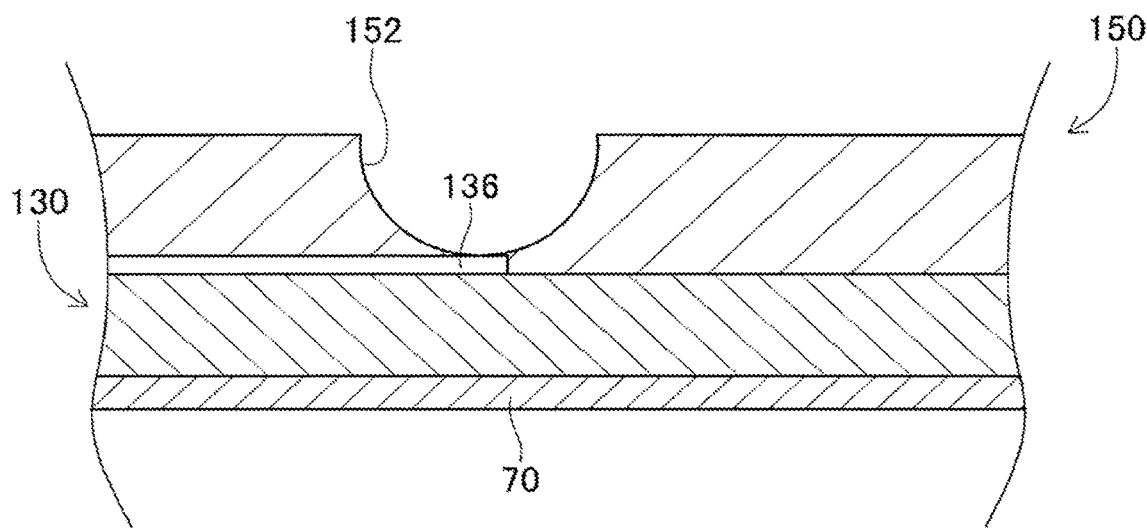
FIG. 11 is a cross-sectional view showing a circuit in a state in which another resin laminate is further formed on the resin laminate.

Next, in second shaping unit 24, as shown in FIG. 11, resin laminate 150 is formed on resin laminate 130. Since resin laminate 150 is formed by substantially the same method as resin laminate 130, a description of the method of forming resin laminate 150 will be omitted. However, cavity 152 is formed in resin laminate 150 so that the end of wiring 136 is exposed through cavity 152.

Figure 12:
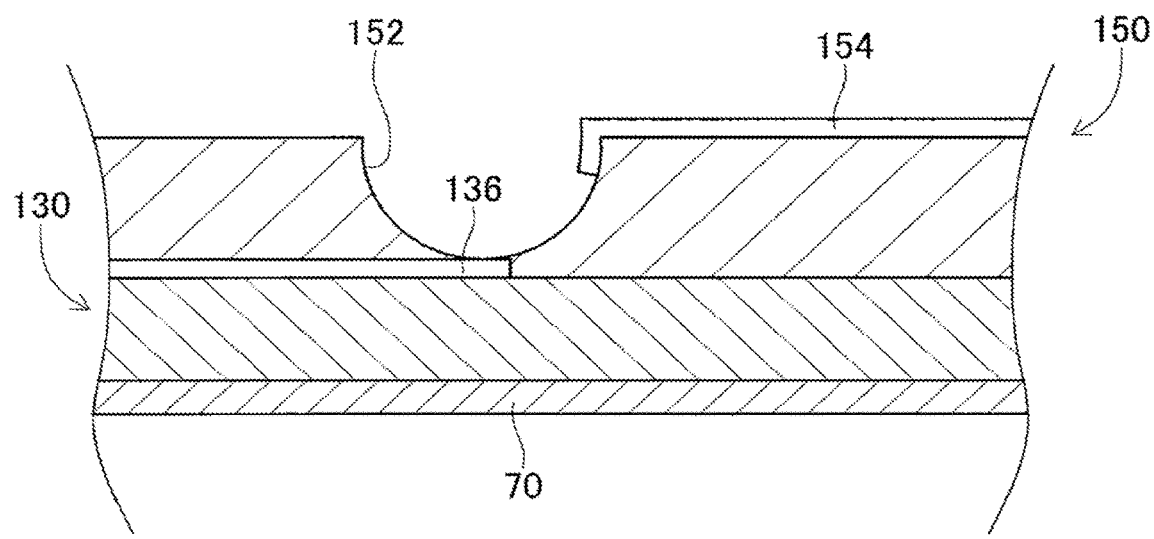
FIG. 12 is a cross-sectional view showing a circuit in a state in which metal ink is discharged on a resin laminate.
Figure 13:
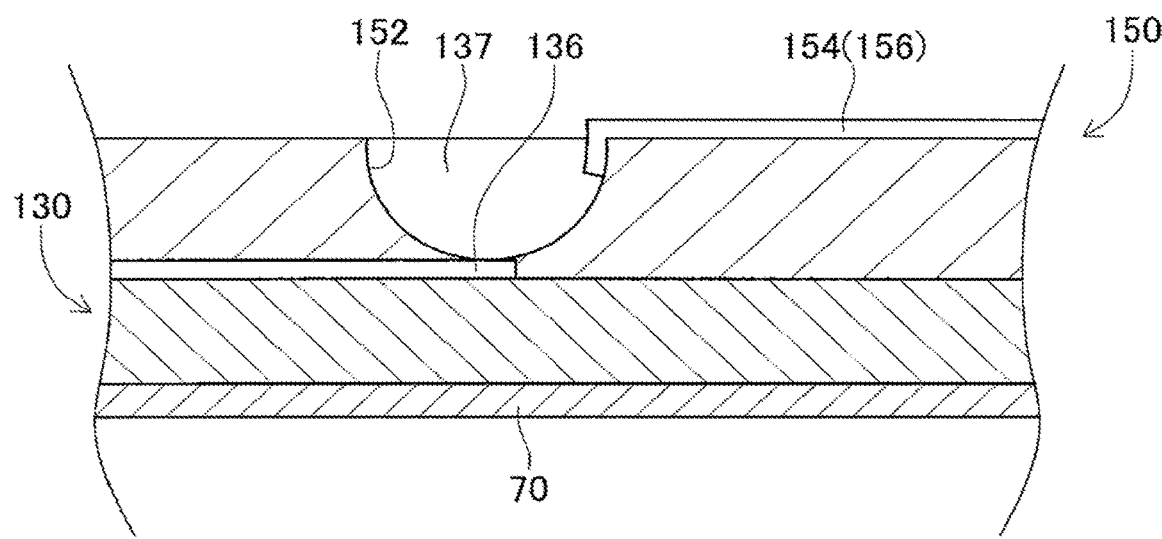
FIG. 13 is a cross-sectional view showing a circuit in a state in which the metallic paste is discharged into a cavity of a resin laminate.

Subsequently, in first shaping unit 22, as shown in FIG. 12, metal ink 154 is linearly discharged by inkjet head 76 onto resin laminate 150. Metal ink 154 is discharged so that the end thereof reaches the inside of cavity 152 but does not reach the bottom surface of cavity 152. Metal paste 137 is then discharged into cavity 152 by dispense head 77 without heating metal ink 154. At this time, as shown in FIG. 13, metal paste 137 is discharged into cavity 152 until it reaches the upper edge of cavity 152. As a result, metal paste 137 contacts metal ink 134 at the bottom end and contacts metal ink 154 at the upper edge.

Thus, when metal ink 154 and metal paste 137 are discharged, metal ink 154 and metal paste 137 are collectively heated with heater 78 at 150° C. for 1 hour and 10 minutes. In this case, metal ink 154 is sintered to form wiring 156 and metal paste 137 is made conductive. As a result, wiring 136 formed on resin laminate 130 and wiring 156 formed on resin laminate 150 become electrically connected via metal paste 137.

As described above, metal ink 154 and metal paste 137 are collectively heated, even when two wirings 136, 156 formed on different resin laminates 130, 150 are electrically connected by metal paste 137. As a result, the occurrence of mechanical deterioration, destruction, or the like can be suppressed in resin laminate 150, while the cycle time is also shortened.

As shown in FIG. 2, controller 120 of control device 28 includes base formation section 160, coating section 162, and heating section 164. Base formation section 160 is a functional section for forming resin laminate 130 in the first embodiment and is a functional section for forming resin laminate 150 in the second embodiment. Coating section 162 is a functional section for applying metal ink 134 and metal paste 137 in the first embodiment and is a functional section for applying metal ink 154 and metal paste 137 in the second embodiment. Heating section 164 is a functional section for collectively heating metal ink 134 and metal paste 137 in the first embodiment and is a functional section for collectively heating metal ink 154 and metal paste 137 in the second embodiment.

In the above embodiment, resin laminates 130, 150 are examples of bases. Resin layer 132 is an example of a resin layer. Metal inks 134, 154 are examples of metal-containing liquids. Metal paste 137 is an example of a metal paste. A step performed by the base formation section 160 is an example of a base formation step. The process performed by coating section 162 is an example of a coating step. The step performed by heating section 164 is an example of a heating step.

The present disclosure is not limited to the embodiments described above, and can be implemented in various embodiments with various modifications and improvements based on the knowledge of those skilled in the art. For example, although metal ink 134, metal paste 137, and the like are heated with heater 78 in the above embodiment, metal ink 134, metal paste 137, and the like may be heated by irradiating laser light or the like.

In the above embodiment, metal ink 134 contains fine metal particles having a nanometer size, and metal paste 137 contains metal particles having a micrometer size, but the particle size can be set to any size. However, metal ink 134 used as the material for wiring 136 preferably contains fine metal particles smaller than the metal particles contained in metal paste 137.

In the above embodiment, metal paste 137 is discharged onto resin laminate 130 by dispense head 77, but metal paste 137 may be transferred onto resin laminate 130 by a stamp or the like. In addition, metal paste 137 may be printed on resin laminate 130 by screen printing.

REFERENCE SIGNS LIST

130: Resin laminate (base), 132: Resin layer, 134: Metal ink (metal-containing liquid), 137: Metal paste, 150: Resin laminate (base), 154: Metal ink (metal-containing liquid), 160: Base formation section (base formation step), 162: Coating section (coating step), 164: Heating section (heating step)

The invention claimed is:

1. A circuit forming method, comprising:
a coating step of applying a metal-containing liquid and a metal paste on the metal-containing liquid in an overlapping manner on a base, the metal-containing liquid containing fine metal particles, the metal paste containing a resin binder and metal particles, a size of the metal particles being larger than a size of the fine metal particles in the metal-containing liquid; and
a heating step of heating the metal-containing liquid and the metal paste at the same time so that the metal-containing liquid is fired and the metal paste becomes conductive.

2. The circuit forming method of claim 1, wherein the circuit forming method further comprises a base forming step of forming the base by forming a resin layer through the application of a curable resin in a thin film form and laminating the resin layer.

3. The circuit forming method of claim 1, wherein, after applying the metal-containing liquid, the coating step applies the metal paste so as to overlap the applied metal-containing liquid.

4. The circuit forming method of claim 1, wherein the heating step heats the metal-containing liquid and the metal paste at a high heating temperature for a long heating time so as to be conductive, the high heating temperature and the long heating time being whichever is higher and is longer respectively taken from among those individually set for making the metal-containing liquid conductive and making the metal paste conductive.

5. The circuit forming method of claim 1, wherein the metal-containing liquid contains nanometer-sized metal particles, and the metal paste contains micrometer-sized metal particles.

6. The circuit forming method of claim 1, wherein the heating step forms a wiring on the base by the heating the metal-containing liquid.

* * * * *